(12) United States Patent
Chen et al.

(10) Patent No.: US 8,703,015 B2
(45) Date of Patent: Apr. 22, 2014

(54) YELLOW FLUOROSULFIDE PHOSPHORS FOR LIGHT-EMITTING DIODE AND PREPARATION METHOD THEREOF

(75) Inventors: Teng-Ming Chen, Hsinchu (TW); Yun-Chen Wu, Taipei (TW)

(73) Assignee: National Chiao Tung University, Hsinchu (TW)

( * ) Notice: Subject to any disclaimer, the term of this patent is extended or adjusted under 35 U.S.C. 154(b) by 600 days.

(21) Appl. No.: 12/978,761

(22) Filed: Dec. 27, 2010

(65) Prior Publication Data

US 2012/0161075 A1 Jun. 28, 2012

(51) Int. Cl.
*C09K 11/08* (2006.01)
*C09K 11/61* (2006.01)
*C09K 11/54* (2006.01)
*C09K 11/56* (2006.01)
*H01J 1/62* (2006.01)
*H01J 63/04* (2006.01)

(52) U.S. Cl.
USPC ............. 252/301.4 H; 252/301.4 S; 313/503

(58) Field of Classification Search
USPC ................ 252/301.4 S, 301.4 H; 313/503
See application file for complete search history.

(56) References Cited

U.S. PATENT DOCUMENTS

| | | | |
|---|---|---|---|
| 6,143,200 A | 11/2000 | Akiwa et al. | |
| 2004/0219116 A1 | 11/2004 | Reynders et al. | |

FOREIGN PATENT DOCUMENTS

| | | |
|---|---|---|
| CN | 101126025 A | 2/2008 |
| EP | 0318813 A1 | 6/1989 |
| JP | 63-294695 | 12/1988 |
| JP | 07-011162 | 1/1995 |
| JP | 10-088128 A | 4/1998 |
| JP | 2003500328 | 1/2003 |
| JP | 2004339475 A | 12/2004 |
| KR | 10-0818601 B1 | 4/2008 |
| KR | 10-0887379 B1 | 3/2009 |
| TW | 201028459 A | 8/2010 |
| WO | WO0073210 A1 | 7/2000 |
| WO | WO00/73210 | * 12/2000 |

OTHER PUBLICATIONS

Demourgues. Rare earth fluorosulfides LnSF and Ln2AF4S2 as new colour pigments.Journal of Alloys and Compounds vols. 323-324, Jul. 12, 2001, pp. 223-230.*
Par N. Rysanek, and O. Loye; Acta Cryst. 1973, B29, 1567-1569.
T Schleid; Z. Anorg. Allg. Chem. 1999, 625, 1700-1706.
T Schleid; Z. Anorg. Allg. Chem. 2000, 626, 2429-2431.
A. Demourgues, A. Tressaud, H. Laronze, and P. Macaudiere; J. Alloys Comp. 2001, 323-324, 223-230.
A. Demourgues, A. Tressaud, H. Laronze, and P. Gravereau and P. Macaudiere: J. Fluorine Chem. 2001, 107, 215-221.
D Pauwels, A. Demourgues, H. Laronze, P. Gravereau, F. Guillen, O. Isnard, and A. Tressaud; Solid State Sci. 2002, 4, 1471-1479.
H. Grossholz, I. Hartenbach, G. Kotzyba, R. Pottgen, H. Trill, B.D. Mosel, and T. Schleid; J Solid State Chem. 2009, 182, 3071-3075.
R. Schmid, and H. Hahn; Z. Anorg. Allg. Chem. 1969, 373, 168-175.

* cited by examiner

*Primary Examiner* — Carol M Koslow
*Assistant Examiner* — Matthew E Hoban
(74) *Attorney, Agent, or Firm* — CKC & Partners Co., Ltd.

(57) ABSTRACT

A novel yellow phosphor of a fluorosulfide having a chemical formula of $(A_{1-x-y}Ce_xB_y)_2Ca_{1-z}Sr_zF_4S_2$ and a tetragonal crystal phase is disclosed, wherein A and B are different rare earth metals other than Ce, the values of x, y, z are $0<x\le1$, $0\le y\le1$, and $0\le z\le1$, respectively. A preparation method of the fluorosulfide and white-light emitting diode application thereof are also disclosed.

17 Claims, 7 Drawing Sheets

YELLOW FLUOROSULFIDE PHOSPHORS FOR LIGHT-EMITTING DIODE AND PREPARATION METHOD THEREOF

BACKGROUND

1. Technical Field

The disclosure relates to a yellow phosphor. More particularly, the disclosure relates to a novel fluorosulfide phosphor for solid-state lighting application.

2. Description of Related Art

Since the invention of blue light-emitting InGaN-based chip in the early 20$^{th}$ century, remarkable progress have been made in the development of commercially realized efficient white light-emitting diodes (WLEDs). By the combination of blue emission from the InGaN-based chips and yellow emission based upon the downconversion of $Y_3Al_5O_{12}:Ce^{3+}$ (YAG:Ce)-based phosphors, the generated white light has already exceeded that of incandescent lamps and is competitive with conventional fluorescent lamps. WLEDs are energy-efficient, life-durable, and environment-friendly in comparison to the conventional light sources. However, the color quality of WLEDs still requires improvement with respect to the white hue tunability, color temperature, and color rendering. In particular, these properties are closely correlated to the general illumination.

For most of the currently applied phosphors in WLEDs system, they do not reach the optimal requirements for white light and show poor color rendition in red spectral region. Therefore, to find a suitable luminescent material for phosphor converted WLEDs (pc-WLEDs) is important to attain the optical requirements for white light.

SUMMARY

In one aspect, the present invention is directed to a yellow phosphor of a fluorosulfide having a chemical formula of $(A_{1-x-y}Ce_xB_y)_2Ca_{1-z}Sr_zF_4S_2$ and a tetragonal crystal phase, wherein A and B are different rare earth metals other than Ce, the values of x, y, z are 0<x≤1, 0≤y≤1, and 0≤z≤1, respectively.

According to an embodiment, the rare earth metal is Sc, Y, or a lanthanoid, wherein the lnathanoids is La, Pr, Nd, Sm, Eu, Gd, Tb, Dy, Ho, Er, Tm, Yb, or Lu.

According to another embodiment, the chemical formula is $(A_{1-x}Ce_x)_2Ca_{1-z}Sr_zF_4S_2$ when y is zero.

According to another embodiment, the chemical formula is $(A_{1-x}Ce_x)_2CaF_4S_2$ when both y and z are zero.

According to another embodiment, the chemical formula is $(A_{1-x}Ce_x)_2SrF_4S_2$ when y is zero and z is 1.

According to another embodiment, the chemical formula is $(A_{1-x-y}Ce_xB_y)_2CaF_4S_2$ when z is zero.

According to another embodiment, the chemical formula is $(A_{1-x-y}Ce_xB_y)_2SrF_4S_2$ when z is 1.

In another aspect, this invention also directs to a white light emitting diode comprising a blue light phosphor and the yellow phosphor of the fluororsulfide described above.

In light of the forgoing, the novel yellow phosphor based on Ce doped fluorosulfide can serve as a potential candidate for white-light LED, especially for generation of warm white-light.

The above presents a simplified summary of the disclosure in order to provide a basic understanding to the reader. This summary is not an extensive overview of the disclosure and it does not identify key/critical elements of the present invention or delineate the scope of the present invention. Its sole purpose is to present some concepts disclosed herein in a simplified form as a prelude to the more detailed description that is presented later.

Many of the attendant features will be more readily appreciated as the same becomes better understood by reference to the following detailed description considered in connection with the accompanying drawings.

DETAILED DESCRIPTION

Figure 1A:
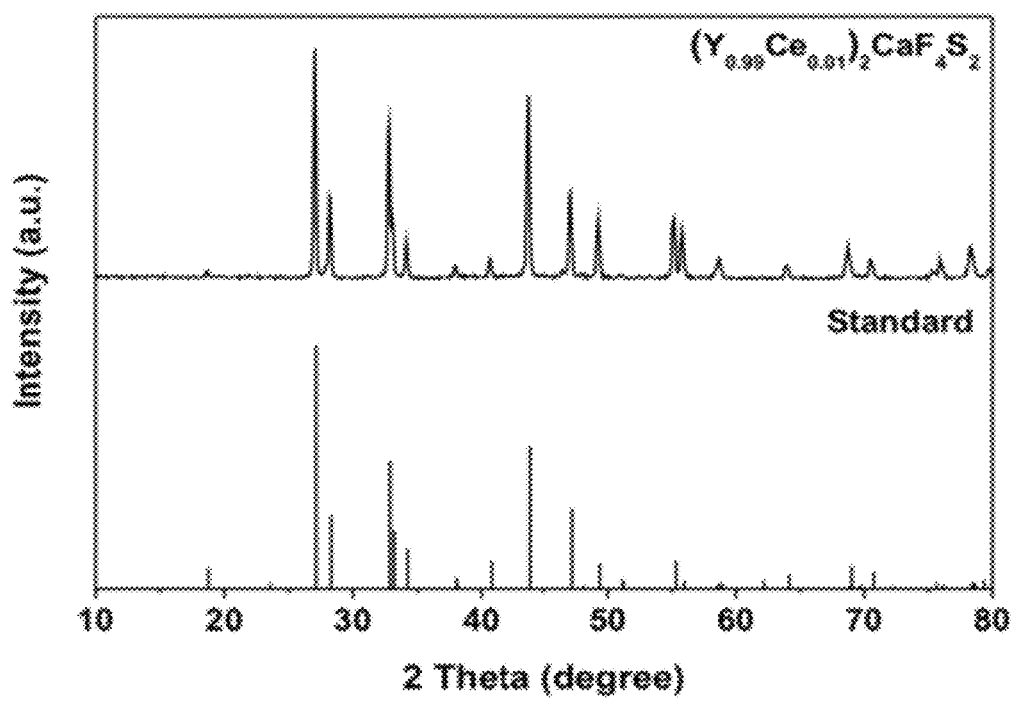
FIGS. 1A-1D are XRD spectra of Examples 1, 9, 2 and 10, respectively.
Figure 1B:
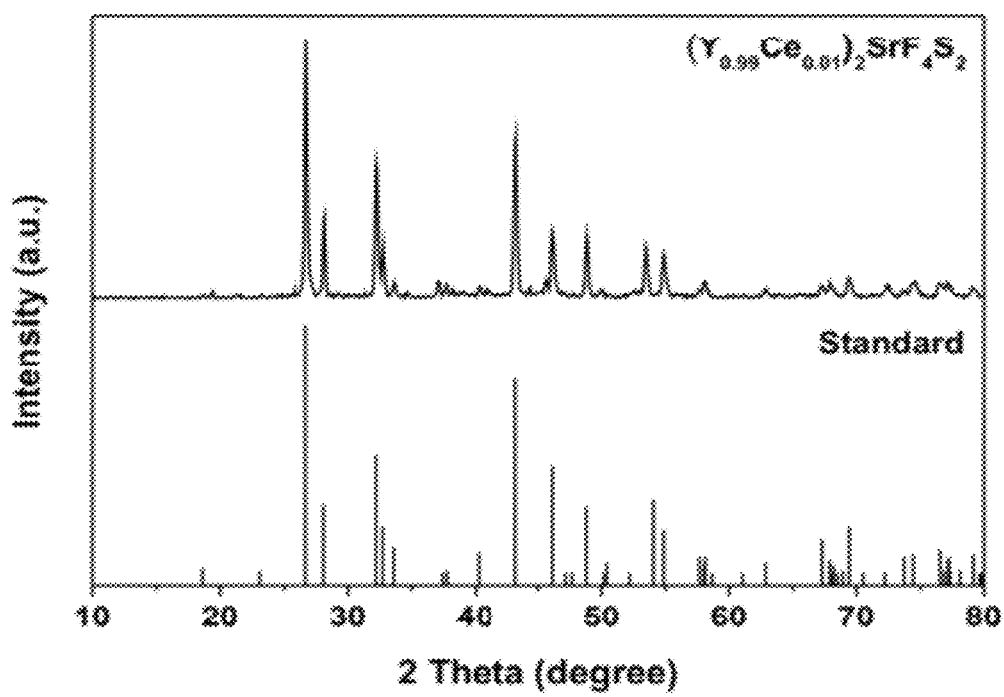

For most phosphors doped with $Ce^{3+}$, they show a parity allowed 4f-5d emission ranging from ultraviolet to red color depending upon the host lattice and on the basis of the site size, site symmetry and coordination number. In fact, the emission color of $Ce^{3+}$ can also be controlled in the desired region of the spectrum by changing the crystal field strength. For example, the optical iii properties of $Ce^{3+}$ dopant in $Ca(Si,Al)N_2:Ce^{3+}$ (red), $(La,Gd)Sr_2AlO_5:Ce^{3+}$ (yellow), $(Ca,Sr)Sc_2O_4:Ce^{3+}$ (green) phosphors have been investigated.

In recent years, great attentions have been attracted to study the mixed-anion fluoroxide crystals doped with $Ce^{3+}$ and show their potentially applicable to WLEDs assemblies, but there has been no reported study on the photoluminescence (PL) properties of the fluorosulfides/mixed-anions system prior to this present work. The quaternary fluorosulfide $Y_2CaF_4S_2$ is isostructural with $Sm_2CaF_4S_2$, which is first announced as a new color pigment. In this compound, the chromatic and chemical properties of rare earth, which is surrounded by fluorine and sulfur ligands, is expected to combine the advantages of sulfides and fluorides.

Yellow Phosphor Material of $(A_{1-x-y}Ce_xB_y)_2Ca_{1-z}Sr_zF_4S_2$

Accordingly, in one aspect, this invention directs to a novel fluorosulfide phosphor having a general chemical formula of $(A_{1-x-y}Ce_xB_y)_2Ca_{1-z}Sr_zF_4S_2$ for emitting yellow light having a CIE value of (0.30-0.60, 0.30-0.60). The lattice structure of $(A_{1-x-y}Ce_xB_y)_2Ca_{1-z}Sr_zF_4S_2$, which is similar to that of $Y_2CaF_4S_2$, is tetragonal space group (I4/mmm, No. 139), wherein $A^{3+}$, $Ce^{3+}$, and/or $B^{3+}$ are isovalent substitutions for $Y^{3+}$ in $Y_2CaF_4S_2$, and $Sr^{2+}$ is a isovalent substitution for $Ca^{2+}$ in $Y_2CaF_4S_2$. Since $Ce^{3+}$ is responsible for emitting yellow light, the value of x is 0<x≤1. The values of y and z are both 0-1. In $(A_{1-x-y}Ce_xB_y)_2Ca_{1-z}Sr_zF_4S_2$, both A and B represents different trivalent rare earth elements other than Ce, such as Sc, Y and lanthanoids, wherein the lanthanoids can be La, Pr, Nd, Sm, Eu, Gd, Tb, Dy, Ho, Er, Tm, Yb, or Lu, for example.

When y and/or z are 0 and/or 1, some simplified chemical formulas of the formula $(A_{1-x-y}Ce_xB_y)_2Ca_{1-z}Sr_zF_4S_2$ can be obtained. For example, when y is zero, simplified to $(A_{1-x}Ce_x)_2 Ca_{1-z}Sr_zF_4S_2$ is obtained. When z is zero, $(A_{1-x-y}Ce_xB_y)_2 CaF_4S_2$ is obtained. When z is 1, $(A_{1-x-y}Ce_xB_y)_2 SrF_4S_2$ is obtained. When y and z are zero, $(A_{1-x}Ce_x)_2 CaF_4S_2$. When y is zero and z is 1, $(A_{1-x}Ce_x)_2SrF_4S_2$ is obtained.

Preparation Method of the $(A_{1-x-y}Ce_xB_y)_2Ca_{1-z}Sr_zF_4S_2$

In another aspect, this invention directs to a preparation method of the novel fluorosulfide phosphor $(A_{1-x-y}Ce_xB_y)_2 Ca_{1-z}Sr_zF_4S_2$. First, according to the chemical formula of the desired $Ce^{3+}$ doped fluorosulfide, stoichiometric amounts of at least one sulfide and at least one fluoride of Ce, at least one rare earth metal other than Ce, Ca and/or Sr are weighted. For example, trivalent Y source can be $YF_3$ or $Y_2S_3$, and divalent Ca source can be CaS or $CaF_2$. According to an embodiment of this invention, when $(Y_{0.99}Ce_{0.01})_2CaF_4S_2$ is synthesized, $YF_3$, $Y_2S_3$, $CaF_2$ and $CeF_3$ can be used as the reactants, for example.

Next, the weighted sulfides and fluorides are grinded until they are uniformly mixed. Then, the mixture is calcined under a vacuum environment, or under an inert gas or nitrogen at a pressure of about 1 atm, and at a temperature of 900-1100° C. until a pure crystal phase is obtained. The crystal phase of the obtained product can be examined by x-ray powder diffracion (XRD) spectrum.

Embodiment 1: $(A_{1-x}Ce_x)_2CaF_4S_2$ (y=z=0)

When y=z=0, $(A_{1-x-y}Ce_xB_y)_2Ca_{1-z}Sr_zF_4S_2$ is simplified to $(A_{1-x}Ce_x)_2CaF_4S_2$. Examples included that A was Y, La, Sm, Eu, Gd or Tb, and x was 0.01, were prepared according to the preparation method described above.

Figure 1C:
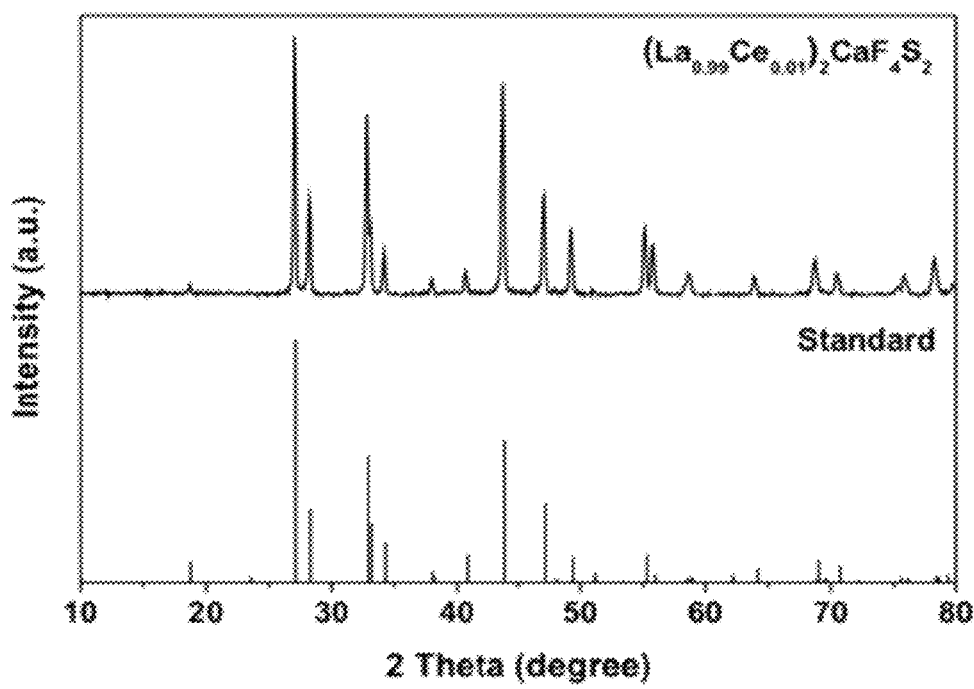
Figure 1D:
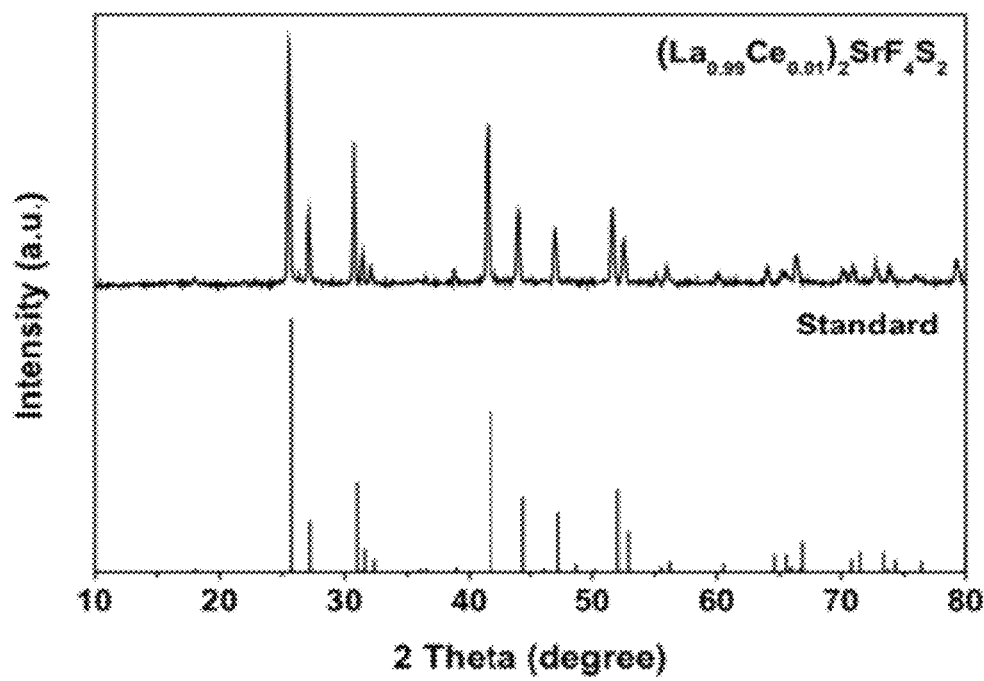
Figure 2A:
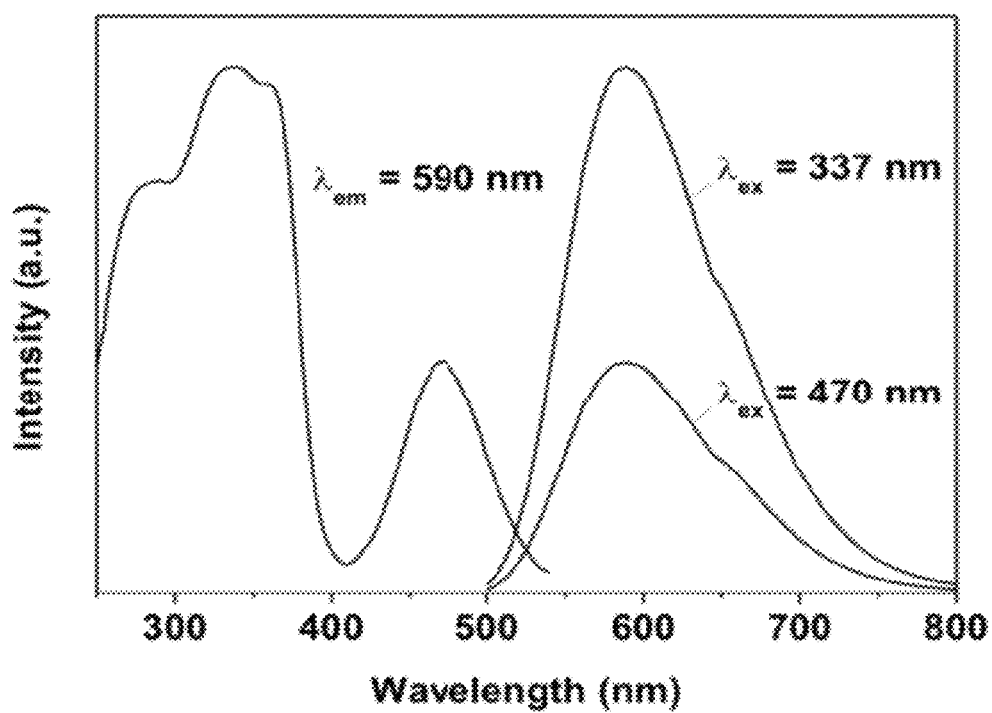
FIGS. 2A-2C are excitation and emission spectra of Examples 1, 8 and 9, respectively.

The XRD spectra of Examples 1 and 2 are shown in FIGS. 1A and 1C. The excitation and emission spectrum of Example 1 is shown in FIG. 2A. The prepared fluorosulfides and photoluminescence properties thereof are listed in Table Comparing FIGS. 1A and 1C, only the trivalent cations were different, i.e. $Y^{3+}$ in FIG. 1A and $La^{3+}$ in FIG. 1C. The isovalent cation substitution with various sizes was used to change the structural environment for $Ce^{3+}$, and the crystal field splitting of $Ce^{3+}$ 5d level was thus changed. Since $Y^{3+}$ and $La^{3+}$ were compatible with the fluorosulfide host lattice, the substitution may result in different emission efficiency and color rendition.

Firstly from Table 1, it can be seen that the 1 mol % substitution of $Ce^{3+}$ can create wide excitation and emission ranges. Thus, this $Ce^{3+}$-doped fluorosulfide system can use UV-to-blue light as the excitation source to meet the request for the pc-WLED applications.

Second, only a little blueshift or redshift occurred relative to the excitation and emission ranges and CIE value of $(Y_{0.99}Ce_{0.01})_2CaF_4S_2$. Roughly speaking, the substitution, such as $La^{3+}$ subsutition, that result in the expansion of Ce—S bonds is expected to decerease the emission wavelength, i.e. blueshift. Contrarily, the substitution that result in the contraction of Ce—S bonds is expected to increase the emission wavelength, i.e. redshift. Therefore, the crystal field strengths sensed by the $Ce^{3+}$ ions were changed by the various trivalent rare earth metal ions, and the emission wavelengths were thus blueshifted or redshifted.

However, the excitation, emission ranges, and the CIE values were also relatively unchanged by the various rare earth elements of A. It can be understood that the sizes of these trivalent rare earth metal ions are only a subtle change for the fluorosulfide's lattice. Hence, the tetragonal aspect ratio and the lattice size of the fluorosulfides are slightly affected.

TABLE 1

Photoluminescence properties of $(A_{0.99}Ce_{0.01})_2CaF_4S_2$, where A was Y, La, Sm, Eu, Gd or Tb.

| | Examples | 9-fold coordination atomic radius (Å) | Main Excitation Range (peak) (nm) | Main Emission Range (peak) (nm) | CIE (x, y) |
|---|---|---|---|---|---|
| 1 | $(Y_{0.99}Ce_{0.01})_2CaF_4S_2$ | 1.075 | 250-547 (300, 337, 470) | 500-800 (590) | (0.53, 0.46) |
| 2 | $(La_{0.99}Ce_{0.01})CaF_4S_2$ | 1.216 | 250-542 (338, 468) | 500-800 (588) | (0.50, 0.48) |
| 3 | $(Sm_{0.99}Ce_{0.01})_2CaF_4S_2$ | 1.132 | 250-542 (341, 470) | 500-800 (589) | (0.53, 0.45) |
| 4 | $(Eu_{0.99}Ce_{0.01})_2CaF_4S_2$ | 1.12 | 250-545 (335, 471) | 503-800 (591, 623) | (0.53, 0.45) |
| 5 | $(Gd_{0.99}Ce_{0.01})_2CaF_4S_2$ | 1.107 | 250-545 (335, 472) | 512-800 (595) | (0.54, 0.47) |
| 6 | $(Tb_{0.99}Ce_{0.01})_2CaF_4S_2$ | 1.095 | 250-545 (335, 471) | 503-800 (548, 591) | (0.53, 0.45) |

Embodiment 2: Substitution of $Ca^{2+}$ by $Sr^{2+}$ in $(A_{1-x}Ce_x)_2 CaF_4S_2$ Next, the $Ca^{2+}$ in $(A_{1-x}Ce_x)_2CaF_4S_2$ (y=0 and z=0) was gradually substituted by $Sr^+$ until $(A_{1-x}Ce_x)_2SrF_4S_2$ (y=0 and z=1) was obtained. Examples included that A was Y or La, x was 0.01, and z=0, 0.1, 0.5, 1, were prepared according to the preparation method described above.

Figure 2B:
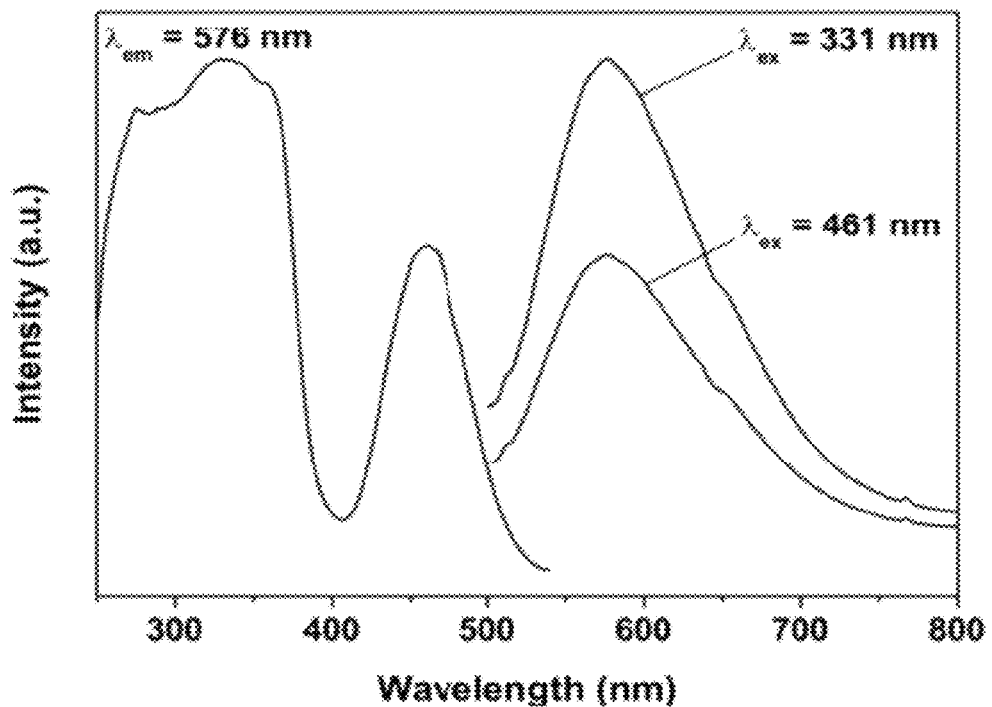
Figure 2C:
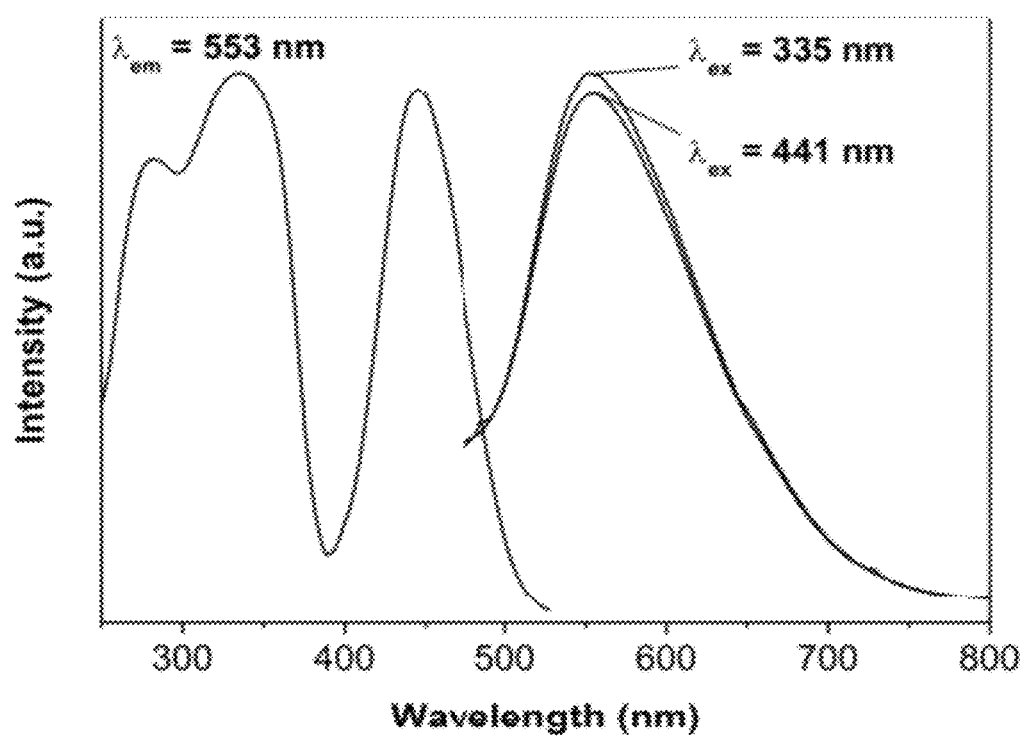

The XRD spectra of Examples 1, 9, 2 and 10 are shown in FIGS. 1A-1D. The excitation and emission spectra of Examples 1, 8 and 9 are shown in FIGS. 2A-2C. The prepared fluorosulfides and photoluminescence properties thereof are listed in Table 2.

From FIGS. 1A-1D, it can be seen that the crystal phase of the $(A_{1-x}Ce_x)_2CaF_4S_2$ was unchanged by the substitution of $Ca^{2+}$ by $Sr^{2+}$ for both Y (examples 1 and 9) and La (examples 2 and 10) series. The crystal phases of these examples were remained the same as $Y_2CaF_4S_2$ with the tetragonal structure. However, the XRD peaks move to lower angle positions after $Ca^{2+}$ was substituted by $Sr^{2+}$. The results shown in FIGS. 1A-1D are in accordance with the ionic size variation where the atomic radii for 8-fold coordination of $Ca^{2+}$ and $Sr^{2+}$ are 1.12 Å and 1.26 Å, respectively. That means, the lattice volume was expanded by the $Sr^+$ substitution.

From FIGS. 2A-2C, it can be seen that both of the excitation and emission spectra were blueshifted. The blue shift phenomena can also be further seen in Table 2 for both Y (examples 1 and 7-9) and La (examples 2 and 10) series. It indicates that the above substitution leads to size expansion of the lattice volume, which is induced by larger $Sr^{2+}$ ionic size. In such cases, the $Ce^{3+}$ ions experience a weaker crystal field splitting due to the expansion of lattice size, and the lowest-lying 5d level is elevated. Therefore, it is reasonable that the blueshifted excitation and emission spectra were observed.

From Table 2, the x value of CIE is decreased as the z value in $(A_{1-x}Ce_x)_2Ca_{1-z}Sr_zF_4S_2$ increased, and the y value is increased as the z value is increased, since the color of the emitted light moves from orange to green-yellow.

TABLE 2

Photoluminescence properties of $(A_{0.99}Ce_{0.01})_2Ca_{1-z}Sr_zF_4S_2$, where $z = 0, 0.1, 0.5, 1$ for Y series and $z = 0, 1$ for La series.

| Examples | Main Excitation Range (peak) (nm) | Main Emission Range (peak) (nm) | CIE(x, y) |
|---|---|---|---|
| 1 $(Y_{0.99}Ce_{0.01})_2CaF_4S_2$ | 250-547 (300, 337, 470) | 500-800 (590) | (0.53, 0.46) |
| 7 $(Y_{0.99}Ce_{0.01})_2Ca_{0.9}Sr_{0.1}F_4S_2$ | 250-545 (300, 335, 467) | 503-800 (585) | (0.52, 0.46) |
| 8 $(Y_{0.99}Ce_{0.01})_2Ca_{0.5}Sr_{0.5}F_4S_2$ | 250-540 (331, 461) | 500-800 (576) | (0.45, 0.47) |
| 9 $(Y_{0.99}Ce_{0.01})_2SrF_4S_2$ | 250-543 (299, 335, 441) | 480-800 (553) | (0.42, 0.53) |
| 2 $(La_{0.99}Ce_{0.01})_2CaF_4S_2$ | 250-542 (338, 468) | 500-800 (588) | (0.50, 0.48) |
| 10 $(La_{0.99}Ce_{0.01})_2SrF_4S_2$ | 250-539 (289, 330, 439) | 475-800 (550) | (0.40, 0.49) |

Embodiment 3: Substitution of the First Traivalent Rare Earth Metal Ion by a Second Trivalent Rare Earth Metal Ion in $(A_{1-x}Ce_x)_2CaF_4S_2$ 10 mol % of the first trivalent rare earth metal ion, A, in $(A_{1-x}Ce_x)_2CaF_4S_2$ (y=0 and z=0) was substituted by a second trivalent rare earth metal ion, B, to obtain $(A_{0.9-x}Ce_xB_{0.1})_2CaF_4S_2$ (y=0.1 and z=0). The first trivalent rare earth metal A in $(A_{0.9-x}Ce_xB_{0.1})_2CaF_4S_2$ (y=0.1 and z=0) was Y, and the second trivalent rare earth metal B was Sc, La, Sm, Eu, Gd, or Tb when x was 0.01 were perepared by the prepartaion method described above. The prepared examples and photoluminesecnce properties are listed in Table 3.

Similar to the results of embodiment 1 (Table 1 above), the trend of the excitation spectra, the emission spectra, and the CIE value were the same as the partial substitution of first trivalent rare earth metal ion, A, by the second trivalent rare earth metal ion, B.

TABLE 3

Photoluminesecnce properties of $(Y_{0.89}Ce_{0.01}B_{0.1})_2CaF_4S_2$, where B was Sc, La, Sm, Eu, Gd, or Tb.

| Examples | Main Excitation Range (peak) (nm) | Main Emission Range (peak) (nm) | CIE(x, y) |
|---|---|---|---|
| 11 $(Y_{0.89}Ce_{0.01}Sc_{0.1})_2CaF_4S_2$ | 250-537 (333, 466) | 520-800 (588) | (0.50, 0.48) |
| 12 $(Y_{0.89}Ce_{0.01}La_{0.1})_2CaF_4S_2$ | 250-538 (335, 467) | 520-800 (588) | (0.51, 0.48) |
| 13 $(Y_{0.89}Ce_{0.01}Sm_{0.1})_2CaF_4S_2$ | 250-540 (349, 467) | 510-800 (589) | (0.52, 0.48) |
| 14 $(Y_{0.89}Ce_{0.01}Eu_{0.1})_2CaF_4S_2$ | 250-539 (357, 468) | 514-800 (589, 624) | (0.52, 0.45) |
| 15 $(Y_{0.89}Ce_{0.01}Gd_{0.1})_2CaF_4S_2$ | 250-545 (358, 468) | 511-800 (594) | (0.53, 0.47) |
| 16 $(Y_{0.89}Ce_{0.01}Tb_{0.1})_2CaF_4S_2$ | 250-539 (356, 468) | 520-800 (548, 589) | (0.52, 0.46) |

Embodiment 4: Substitution of $Ca^{2+}$ Ion by $Sr^{2+}$ Ion in $(A_{1-x-y}Ce_xB_y)_2CaF_4S_2$ The $Ca^{2+}$ in $(Y_{0.89}Ce_{0.01}B_{0.1})_2CaF_4S_2$ of embodiment 3 (examples 11-16) was further substituted by $Sr^{2+}$ to verify the lattice size expansion effect. The results are shown in Table 4, and the excitation and emission spectra of examples 12, 18, and 23 are shown in FIGS. 3A-3C.

Figure 3A:
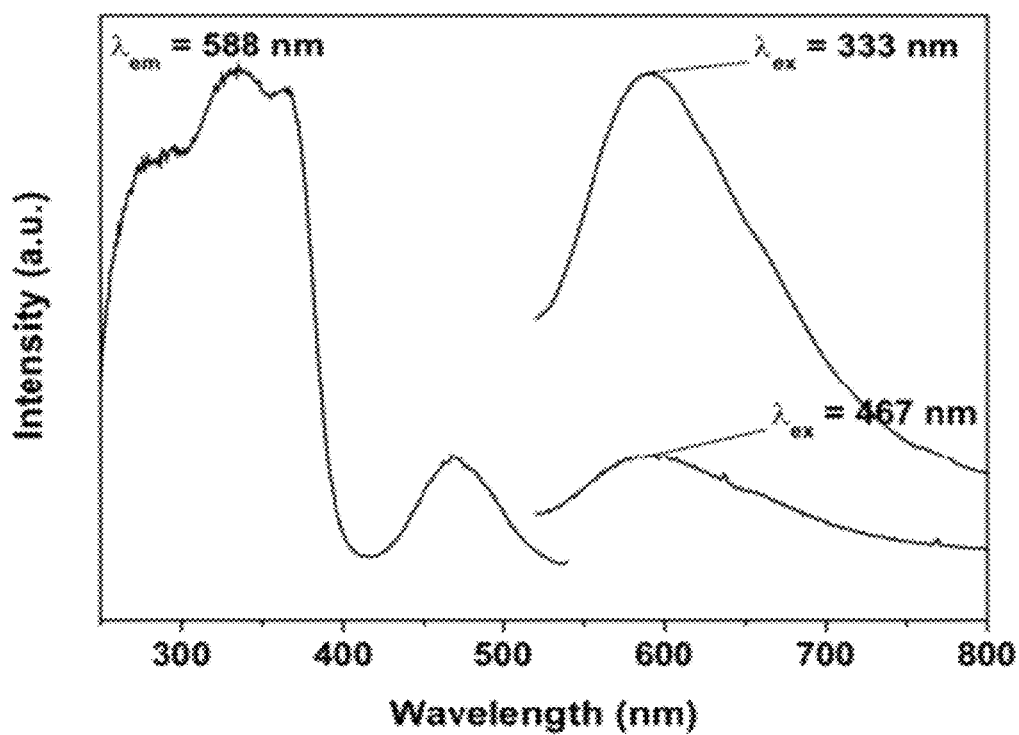
FIGS. 3A-3C are excitation and emission spectra of Examples 12, 18 and 23, respectively.
Figure 3B:
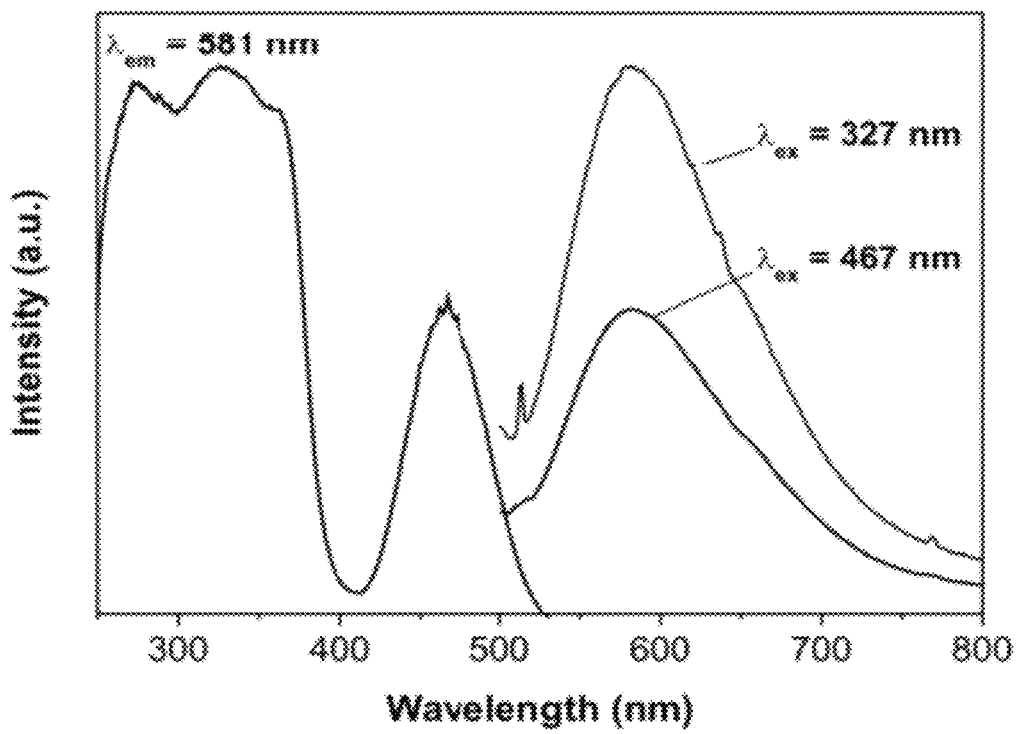
Figure 3C:
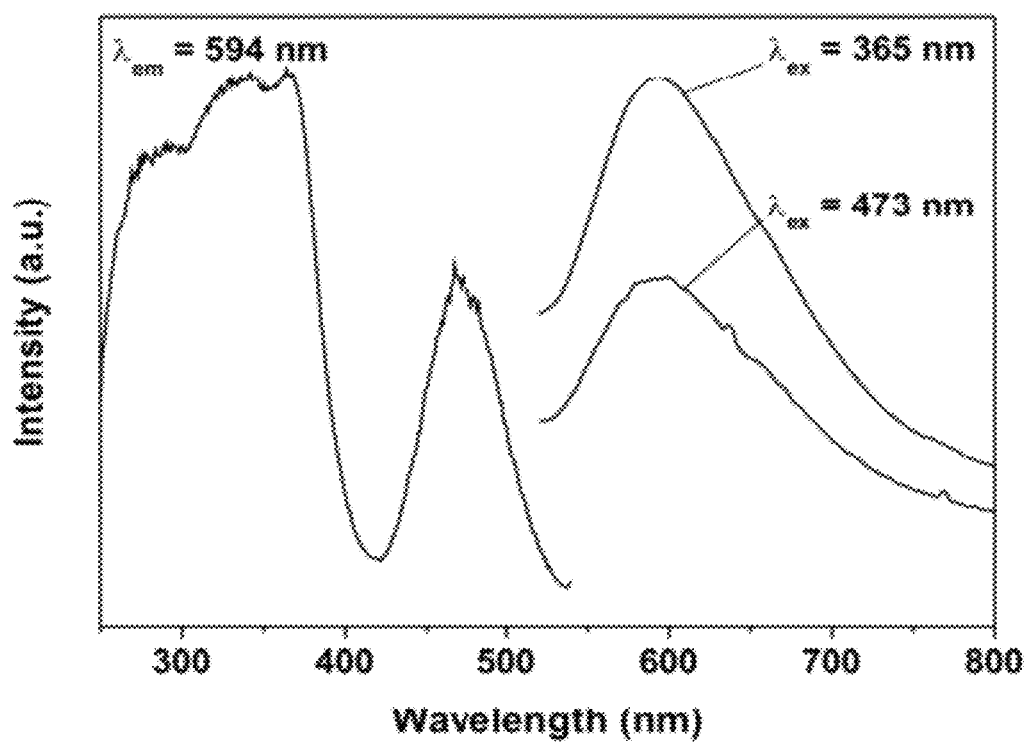

From Table 4 and FIGS. 3A-3C, it can be seen that the blue shift of both excitation and emission spectra was not obvious, and the CIE values were also about the same. This result is different from Embodiment 2 above. Comparing Embodiments 1 and 2, it can be known that the divalent cations have greater influence than trivalent cations on the fluorosulfide's lattice size and thus the emission energy. Therefore, the result of this Embodiment 4 implies that the emission energy is not simply determined by the crystal field, but also by some other factors, such as the covalent-ionic percentage of the Ce—S coordination bonds.

TABLE 4

Photoluminesecnce properties of $(Y_{0.89}Ce_{0.01}B_{0.1})_2Ca_{1-z}Sr_zF_4S_2$, where B was Sc, La, Sm, Eu, Gd, or Tb, z is 0 and 0.1 for Sc, Sm, Eu, Gd, and Tb series, and z is 0, 0.1, and 1 for La series.

| Examples | Main Excitation Range (peak) (nm) | Main Emission Range (peak) (nm) | CIE(x, y) |
|---|---|---|---|
| 11 $(Y_{0.89}Ce_{0.01}Sc_{0.1})_2CaF_4S_2$ | 250-537 (333, 466) | 520-800 (588) | (0.50, 0.48) |
| 17 $(Y_{0.89}Ce_{0.01}Sc_{0.1})_2Ca_{0.9}Sr_{0.1}F_4S_2$ | 250-545 (300, 334, 465) | 503-800 (585) | (0.52, 0.46) |
| 12 $(Y_{0.89}Ce_{0.01}La_{0.1})_2CaF_4S_2$ | 250-538 (335, 467) | 520-800 (588) | (0.51, 0.48) |

TABLE 4-continued

Photoluminesence properties of $(Y_{0.89}Ce_{0.01}B_{0.1})_2Ca_{1-z}Sr_zF_4S_2$, where B was Sc, La, Sm, Eu, Gd, or Tb, z is 0 and 0.1 for Sc, Sm, Eu, Gd, and Tb series, and z is 0, 0.1, and 1 for La series.

| Examples | | Main Excitation Range (peak) (nm) | Main Emission Range (peak) (nm) | CIE(x, y) |
|---|---|---|---|---|
| 18 | $(Y_{0.89}Ce_{0.01}La_{0.1})_2Ca_{0.9}Sr_{0.1}F_4S_2$ | 250-546 (298, 331, 467) | 505-800 (585) | (0.52, 0.45) |
| 23 | $(Y_{0.89}Ce_{0.01}La_{0.1})_2SrF_4S_2$ | 250-538 (365, 473) | 520-800 (594) | (0.52, 0.48) |
| 13 | $(Y_{0.89}Ce_{0.01}Sm_{0.1})_2CaF_4S_2$ | 250-540 (349, 467) | 510-800 (589) | (0.52, 0.48) |
| 19 | $(Y_{0.89}Ce_{0.01}Sm_{0.1})_2Ca_{0.9}Sr_{0.1}F_4S_2$ | 250-546 (300, 335, 468) | 501-800 (587) | (0.53, 0.45) |
| 14 | $(Y_{0.89}Ce_{0.01}Eu_{0.1})_2CaF_4S_2$ | 250-539 (357, 468) | 514-800 (589, 624) | (0.52, 0.45) |
| 20 | $(Y_{0.89}Ce_{0.01}Eu_{0.1})_2Ca_{0.9}Sr_{0.1}F_4S_2$ | 250-546 (299, 332, 466) | 509-800 (586, 623) | (0.51, 0.44) |
| 15 | $(Y_{0.89}Ce_{0.01}Gd_{0.1})_2CaF_4S_2$ | 250-545 (358, 468) | 511-800 (594) | (0.53, 0.47) |
| 21 | $(Y_{0.89}Ce_{0.01}Gd_{0.1})_2Ca_{0.9}Sr_{0.1}F_4S_2$ | 250-527 (275, 327, 467) | 506-800 (587) | (0.50, 0.49) |
| 16 | $(Y_{0.89}Ce_{0.01}Tb_{0.1})_2CaF_4S_2$ | 250-539 (356, 468) | 520-800 (548, 589) | (0.52, 0.46) |
| 22 | $(Y_{0.89}Ce_{0.01}Tb_{0.1})_2Ca_{0.9}Sr_{0.1}F_4S_2$ | 250-527 (283, 331, 463) | 507-800 (547, 588) | (0.51, 0.48) |

Figure 4:
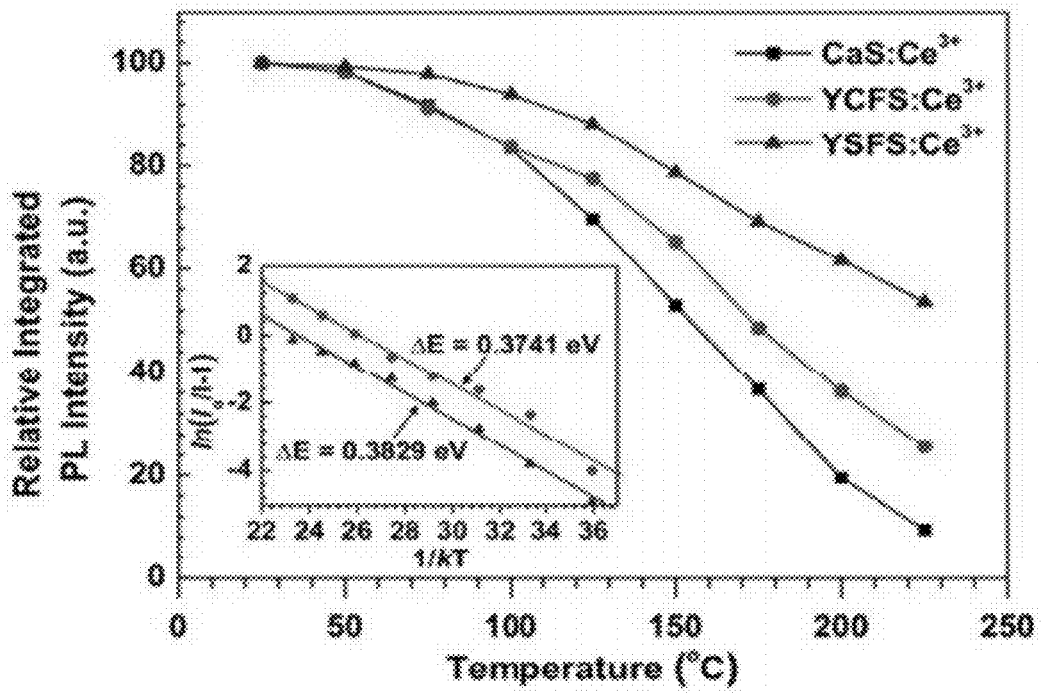
FIG. 4 shows the temperature dependent photoluminescence intensity of $CaS:Ce^{3+}$, $(Y_{0.99}Ce_{0.01})_2CaF_4S_2$ and $(Y_{0.99}Ce_{0.01})_2SrF_4S_2$.

Embodiment 5: Temperature Dependent Photoluminescence Intensity for $(Y_{0.99}Ce_{0.01})_2CaF_4S_2$ and $(Y_{0.99}Ce_{0.01})_2SrF_2S_2$ In this embodiment 5, the temperature dependent behavior of the photoluminescence (PL) intensity of both $(Y_{0.99}Ce_{0.01})_2 CaF_4S_2$ and $(Y_{0.99}Ce_{0.01})_2SrF_4S_2$ were examined. FIG. 4 shows the temperature dependent photoluminescence intensity of commercial $CaS:Ce^{3+}$, $(Y_{0.99}Ce_{0.01})_2 CaF_4S_2$ and $(Y_{0.99}Ce_{0.01})_2SrF_4S_2$ in the range of 25-225° C.

In FIG. 4, the PL intensities in all samples are found to be diminished as compared to that of the same sample observed at room temperature, which may be explained on the basis of the increasing thermal energy is utilized to excite electrons to the lowest state of the conduction band and then ionized. Surprisingly, the thermal stability of fluorosulfides were comparable to or even more stable than that of binary sulfides, $CaS:Ce^{3+}$. The introduction of F atoms into the sulfide host lattice can lower the extent of thermal quenching as a result of the softer phonon modes.

In FIG. 4, the values of ΔE for $(Y_{0.99}Ce_{0.01})_2CaF_4S_2$ and $(Y_{0.99}Ce_{0.01})_2SrF_4S_2$ are estimated to be 0.3741 and 0.3829 eV, respectively. The ΔE represents the thermal energy that excites the electrons to the 5d states of $Ce^{3+}$ ions. It can be seen that the $(Y_{0.99}Ce_{0.01})_2CaF_4S_2$ shows higher activation energy characteristic than that of $(Y_{0.99}Ce_{0.01})_2SrF_4S_2$, since weaker crystal field strength was experienced by $Ce^{3+}$ ions in $(Y_{0.99}Ce_{0.01})_2SrF_4S_2$.

Figure 5:
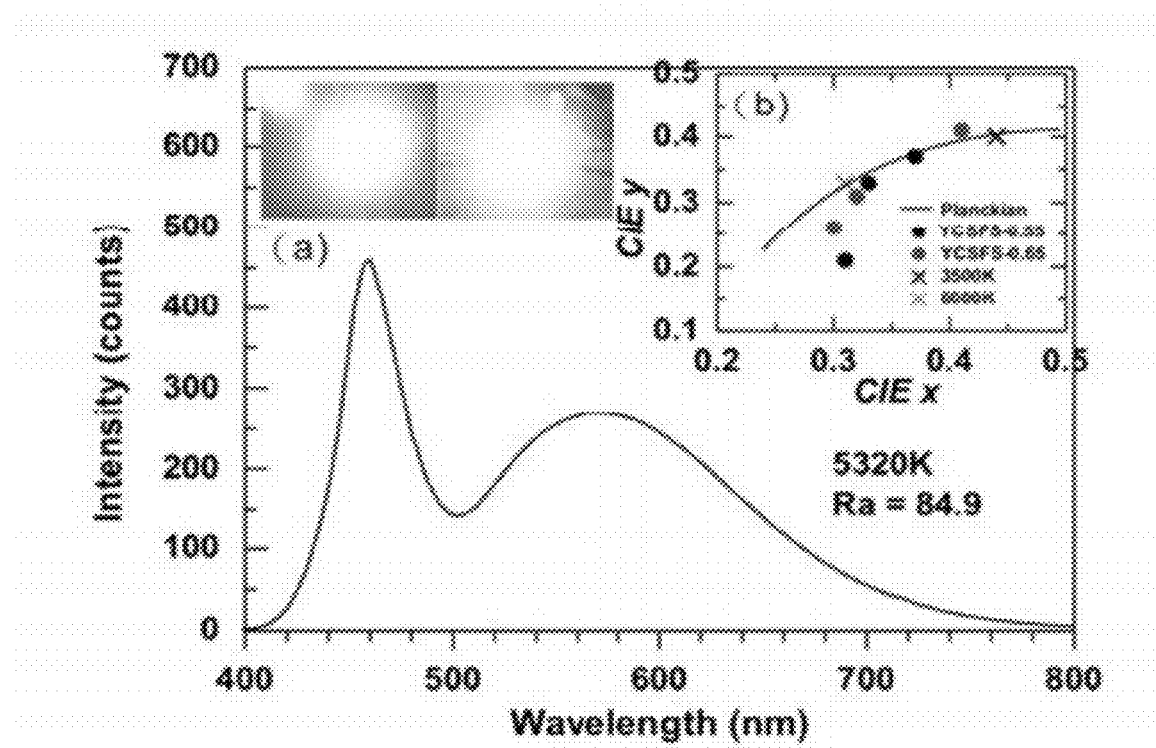
FIG. 5(a) is a visible photoluminescence spectrum of a WLED using the yellow phosphor of $(Y_{0.99}Ce_{0.01})_2Ca_{0.65}Sr_{0.55}F_4S_2$ with 0.1 mm thick and an InGaN LED chip emitting blue light of 460 nm.
FIG. 5(b) shows the variation in CIE chromaticity coordinates as a function of fraction of phosphor used.

Embodiment 6: pc-WLEDs Application of $(Y_{0.99}Ce_{0.01})_2 Ca_{1-z}Sr_zF_4S_2$ To demonstrate the potential of $(Y_{0.99}Ce_{0.01})_2Ca_{1-z}Sr_zF_4S_2$ for pc-WLEDs application, two phosphors with z values of 0.55 and 0.65 were utilized to fabricate pc-WLEDs with an InGaN LED chip emitting blue light of 460 nm. The typical visible photoluminescence spectrum of this WLED was shown in FIG. 5(a), and the variation in CIE chromaticity coordinates as a function of fraction of phosphor used was shown in FIG. 5(b) as an inset. In FIG. 5, the phosphor of $(Y_{0.99}Ce_{0.01})_2Ca_{0.65}Sr_{0.55}F_4S_2$ was noted as YCSFS-0.55, and the other phosphor of $(Y_{0.99}Ce_{0.01})_2Ca_{0.55}Sr_{0.65}F_4S_2$ was noted as YCSFS-0.65. The whole visible spectral region in FIG. 5 can be obtained when excited by the blue chip and the color rendering index (CRI) Ra of this dichromatic pc-WLEDs was determined to be around 74 to 85.

The Commission International de l'Eclairage (CIE) chromaticity coordinates, the correlating color temperature (CCT) of the pc-WLEDs and the corresponding luminous efficiency are shown in Table 5. In Table 5, compare with the pc-WLEDs using conventional YAG:$Ce^{3+}$ phosphor having Ra values in the range from 70 to 75 and color temperature 6,900K. Therefore, the generated dichromatic white light in this work possess two better properties, higher Ra and lower color temperature.

TABLE 5

Optical and chromaticity parameters for pc-WLEDs with YCSFS-0.55 and YCSFS-0.65 as the conversion phosphor layer.

| Sample | Thickness (nm) | CIE(x, y) | CCT (k) | CRI (Ra) | Luminous (lm/W) |
|---|---|---|---|---|---|
| YCSFS-0.55 | 1 | (0.31, 0.21) | 6,962 | 83.5 | 19.8 |
| | 2 | (0.33, 0.33) | 5,320 | 84.9 | 16.7 |
| | 3 | (0.37, 0.37) | 4,201 | 81.6 | 14.2 |
| YCSFS-0.65 | 1 | (0.30, 0.26) | 8,772 | 83.9 | 29.18 |
| | 2 | (0.32, 0.31) | 5,812 | 85 | 27 |
| | 3 | (0.41, 0.41) | 3,511 | 74 | 17.43 |

According to the disclosure above, the novel yellow phosphor based on Ce doped fluorosulfide can serve as a potential candidate for white-light LED, especially for generation of warm white-light. Moreover, only 1 mol % substitution of $Ce^{3+}$ can create wide excitation and emission ranges. Thus, this $Ce^{3+}$-doped fluorosulfide system can use UV-to-blue light as the excitation source to meet the request for the pc-WLED applications.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, each feature disclosed is one example only of a generic series of equivalent or similar features.

What is claimed is:

1. A yellow phosphor of a fluorosulfide having a chemical formula of $(A_{1-x-y}Ce_xB_y)_2Ca_{1-z}Sr_zF_4S_2$ and a tetragonal crystal phase, wherein A and B are different rare earth metals other than Ce, the values of x, y, z are $0<x\le0.01$, $0\le y\le1$, and $0\le z\le1$, respectively.

2. The fluorosulfide of claim 1, wherein the rare earth metal is Sc, Y, or a lanthanoid.

3. The fluorosulfide of claim 2, wherein the lnathanoid is La, Pr, Nd, Sm, Eu, Gd, Tb, Dy, Ho, Er, Tm, Yb, or Lu.

4. The fluorosulfide of claim 1, wherein y is zero and the chemical formula is $(A_{1-x}Ce_x)_2Ca_{1-z}Sr_zF_4S_2$.

5. The fluorosulfide of claim 4, wherein z is zero and the chemical formula is $(A_{1-x}Ce_x)_2CaF_4S_2$.

6. The fluorosulfide of claim 4, wherein z is 1 and the chemical formula is $(A_{1-x}Ce_x)_2SrF_4S_2$.

7. The fluorosulfide of claim 1, wherein z is zero and the chemical formula is $(A_{1-x-y}Ce_xB_y)_2CaF_4S_2$.

8. The fluorosulfide of claim 1, wherein z is 1 and the chemical formula is $(A_{1-x-y}Ce_xB_y)_2SrF_4S_2$.

9. A white light emitting devise, comprising:
a blue light phosphor; and
a yellow light phosphor having a chemical formula of $(A_{1-x-y}Ce_xB_y)_2Ca_{1-z}Sr_zF_4S_2$ and a tetragonal crystal phase, wherein A and B are different rare earth metals other than Ce, the values of x, y, z are $0<x\le1$, $0\le y\le1$, and $0\le z\le1$, respectively.

10. The white light emitting device of claim 9, wherein the rare earth metal is Sc, Y, or a lanthanoid.

11. The white light emitting device of claim 10, wherein the lnathanoid is La, Pr, Nd, Sm, Eu, Gd, Tb, Dy, Ho, Er, Tm, Yb, or Lu.

12. The white light emitting device of claim 9, wherein y is zero and the chemical formula is $(A_{1-x}Ce_x)_2Ca_{1-z}Sr_zF_4S_2$.

13. The white light emitting device of claim 12, wherein z is zero and the chemical formula is $(A_{1-x}Ce_x)_2CaF_4S_2$.

14. The white light emitting device of claim 12, wherein z is 1 the chemical formula is $(A_{1-x}Ce_x)_2SrF_4S_2$.

15. A preparation method of the fluorosulfide of claim 1, comprising:
weighting stoichiometric amounts of at least one sulfide and at least one fluoride of Ce, at least one rare earth metal other than Ce, Ca and/or Sr according to the desired chemical formula in claim 1;
uniformly mixing the at least one sulfide and the at least one fluoride by grinding to form a mixture; and
calcining the mixture under a vacuum environment at a temperature of 900-1100° C. until a pure crystal phase is obtained.

16. The preparation method of claim 15, wherein the rare earth metal is Sc, Y, or a lanthanoid.

17. The preparation method of claim 16, wherein the lnathanoid is La, Pr, Nd, Sm, Eu, Gd, Tb, Dy, Ho, Er, Tm, Yb, or Lu.

* * * * *